US007583176B1

(12) United States Patent
Robinson

(10) Patent No.: US 7,583,176 B1
(45) Date of Patent: Sep. 1, 2009

(54) SWITCH APPARATUS

(75) Inventor: Kevin L. Robinson, Clay, NY (US)

(73) Assignee: Lockheed Martin Corporation, Bethesda, MD (US)

( * ) Notice: Subject to any disclaimer, the term of this patent is extended or adjusted under 35 U.S.C. 154(b) by 420 days.

(21) Appl. No.: 11/370,766

(22) Filed: Mar. 8, 2006

(51) Int. Cl.
*H01H 37/32* (2006.01)
*H01L 29/08* (2006.01)

(52) U.S. Cl. ........................ 337/167; 337/298; 257/108; 257/43

(58) Field of Classification Search ................. 333/101, 333/103, 104, 262; 257/108, 43; 337/158, 337/167, 298
See application file for complete search history.

(56) References Cited

U.S. PATENT DOCUMENTS 3,503,902 A * 3/1970 Takeshi ...................... 252/517
3,598,762 A * 8/1971 Hisao-Futaki et al. .... 252/520.4
4,310,837 A * 1/1982 Kornrumpf et al. ......... 340/598
6,403,874 B1 * 6/2002 Shakouri et al. ............ 136/201

FOREIGN PATENT DOCUMENTS

JP 53132797 A * 11/1978
JP 04299802 A * 10/1992
SU 491163 A * 2/1976

OTHER PUBLICATIONS

Sovero, E. et al; "Fast Thin Film Vanadium Oxide Microwave Switches"; Proceedings of the Gallium Arsenide Integrated Circuit Symposium. (GaAs IC); U.S. New York, IEEE Bd. Symp. 12; Oct. 7, 1990; pp. 101-103.*

* cited by examiner

*Primary Examiner*—Anatoly Vortman
(74) *Attorney, Agent, or Firm*—Howard IP Law Group, PC

(57) ABSTRACT

A circuit including: at least one conductor; a least one vanadium oxide region electrically coupled to the at least one conductor; and, at least one thermionic cooler thermally coupled to the vanadium oxide region; wherein, the thermionic cooler is suitable for transitioning the at least one vanadium oxide region from a first temperature range where the at least one vanadium oxide region is substantially conductive to a second temperature range where the at least one vanadium oxide region is substantially non-conductive.

3 Claims, 11 Drawing Sheets

*Fig. 6*
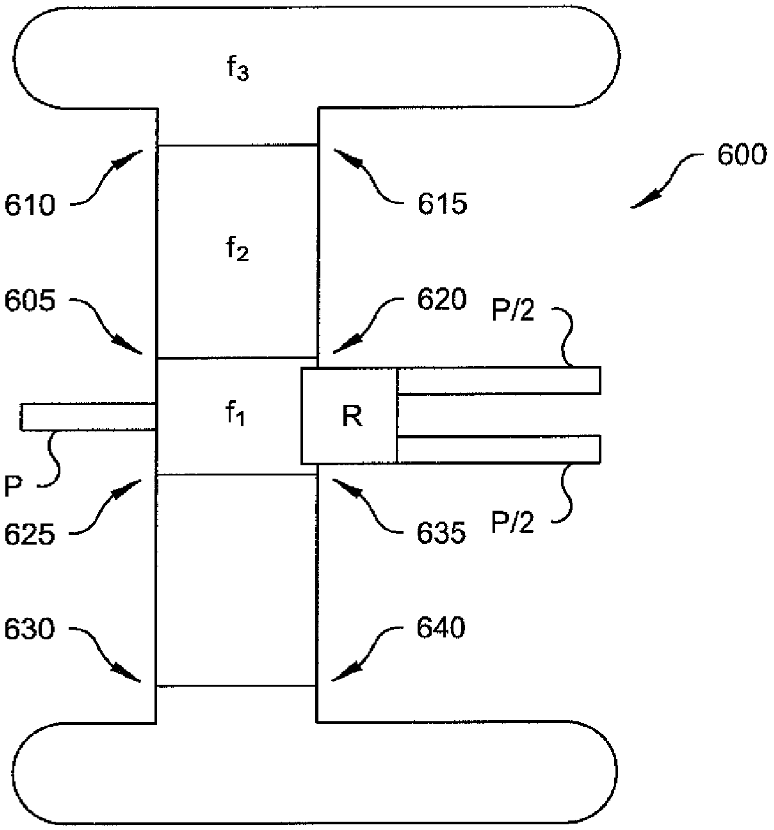
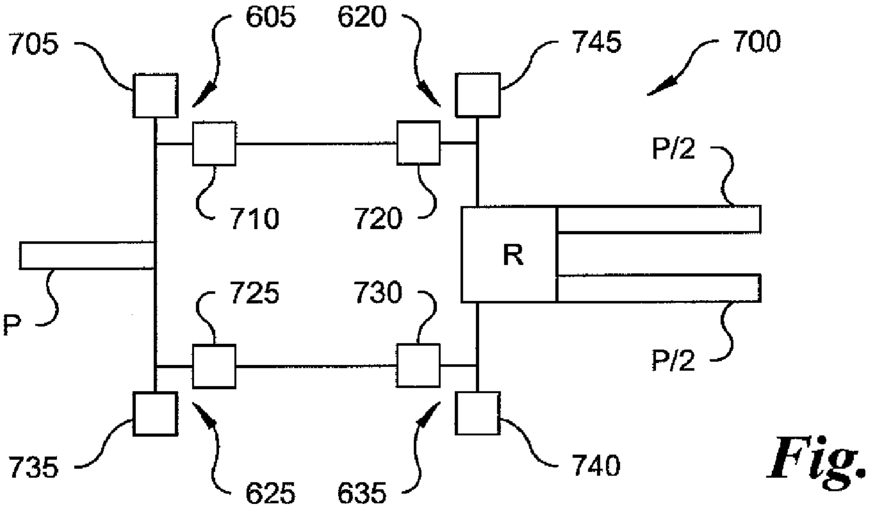
*Fig. 7*

SWITCH APPARATUS

FIELD OF INVENTION

The present invention relates to temperature dependent switch apparatus, and particularly to temperature dependent switch apparatus suitable for use with phased array radars.

BACKGROUND OF THE INVENTION

Phased array radar antennas are generally known and implemented. Phased array antennas include apertures formed from a multitude of radiating elements. Each radiating element is individually controlled in phase and amplitude. In this manner, desired radiating patterns and directions may be achieved. By rapidly switching the elements to switch beams, multiple radar functions may be realized.

SUMMARY OF THE INVENTION

A circuit including: at least one conductor; a least one vanadium oxide region electrically coupled to the at least one conductor; and, at least one thermionic cooler thermally coupled to the vanadium oxide region; wherein, the thermionic cooler is suitable for transitioning the at least one vanadium oxide region from a first temperature range where the at least one vanadium oxide region is substantially conductive to a second temperature range where the at least one vanadium oxide region is substantially non-conductive.

BRIEF DESCRIPTION OF THE DRAWINGS

Understanding of the present invention will be facilitated by consideration of the following detailed description of the preferred embodiments taken in conjunction with the accompanying drawings, wherein like numerals refer to like parts and:

FIG. 6 illustrates a Wilkinson coupler configuration according to an embodiment of the present invention;

FIG. 7 illustrates an embodiment of a portion of the configuration of FIG. 6 according to an embodiment of the present invention;

DETAILED DESCRIPTION OF THE PREFERRED EMBODIMENTS

It is to be understood that the figures and descriptions of the present invention have been simplified to illustrate elements that are relevant for a clear understanding of the present invention, while eliminating, for the purpose of clarity, many other elements found in typical radar antenna arrays and signal processing systems. Those of ordinary skill in the art may recognize that other elements and/or steps are desirable and/or required in implementing the present invention. However, because such elements and steps are well known in the art, and because they do not facilitate a better understanding of the present invention, a discussion of such elements and steps is not provided herein.

Figure 1:
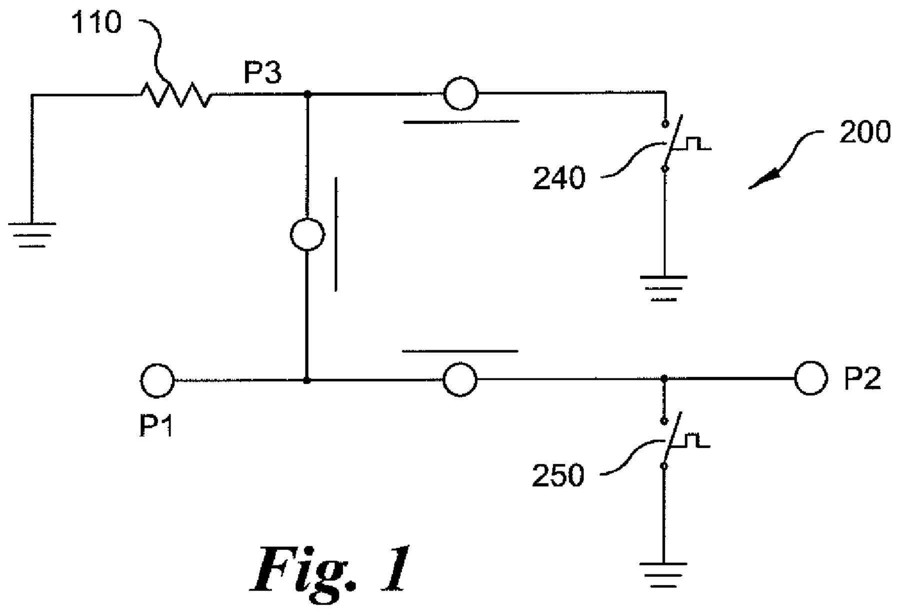
FIG. 1 illustrates a diagram of phased-array radar transmit/receive switch circuitry that may be controlled according to an embodiment of the present invention.

Referring now to FIG. 1, there is shown phased-array antenna transmit/receive switch circuit 200 according to an aspect of the present invention. As will be understood by those possessing an ordinary skill in the pertinent arts, the present invention has applicability in a wide variety of applications. The present invention will be discussed as it relates to reconfigurable circuit 200 for non-limiting purposes of explanation only. Circuit 200 includes an input terminal P1 microstrip coupled between a transmit terminal P3 and receive terminal P2, and ground through switching devices 240, 250. Transmit terminal P3 is coupled to waste load 110. "Microstrip", as used herein, generally refers to a transmission line used for transmitting high frequency signals, such as radio frequency or microwave frequency signals. A microstrip may typically take the form of a thin, strip-like transmission line mounted on a flat dielectric substrate, in-turn mounted on a ground plane.

Switching devices 240, 250 may each be operated in a first mode, which essentially provides a low electrical resistance condition, such that signals are steered from input terminal P1 to transmit terminal P3 and hence waste load 110. Devices 240, 250 may each also be operated in a second mode that essentially provides a high electrical resistance condition, such that signals are steered to receive terminal P2.

Switching devices 240, 250 are temperature dependent. Subjecting each of devices 240, 250 to a first temperature range effects their operation in the first mode, while subjecting them to a second temperature range effects their operation in the second mode. As will be understood by those possessing an ordinary skill in the pertinent arts, such a control mechanism is separate from the radio frequency (RF) signal path. Accordingly, such an approach advantageously may omit wires, jumpers and materials that deleteriously affect RF performance and compromise circuit performance, as is discussed in commonly-assigned, United States Patent Application Serial No. 11/371,174 entitled RF/MICROWAVE INTEGRATED SWITCH SUITABLE FOR USE WITH PHASED ARRAY RADAR ANTENNA, the entire disclosure of which is hereby incorporated by reference herein.

In one configuration, switching devices 240, 250 may take the form of vanadium oxide interconnections, such as vanadium (IV) oxide ($VO_2$). Other vanadium oxide materials, such as vanadium (II) oxide (VO), vanadium (III) oxide ($V_2O_3$) and vanadium (V) oxide ($V_2O_5$) may also be suitable for use. The present invention will be further discussed as it relates to vanadium (IV) oxide, for non-limiting purposes of explanation.

Figure 2:
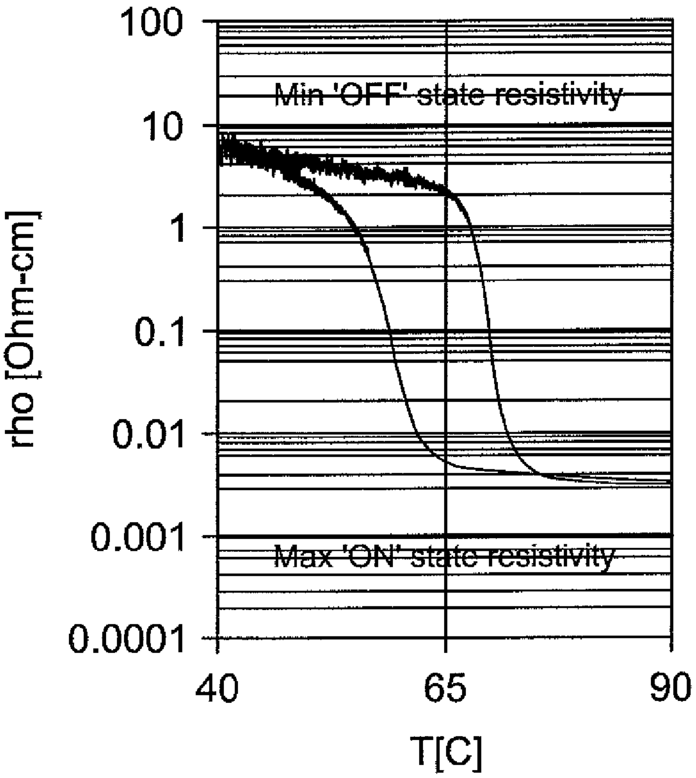
FIG. 2 illustrates a $VO_2$ interdependence of resistance and temperature that may be used according to an embodiment of the present invention.

Referring now to FIG. 2, there is shown a dependence of the resistivity (in Ω-cm) of $VO_2$ as a function of temperature (in ° C.). As may be understood, $VO_2$ has a resistivity corresponding to a low resistance, on-state or the above-referenced first mode (e.g., <0.01 Ω-cm) in a temperature range above about 72° C. Further, $VO_2$ has a high resistivity corresponding to an off-state or the above-referenced second mode (e.g., >1 Ω-cm) in a temperature range less than about 62° C. Accordingly, $VO_2$ based electrical interconnections may be selectively operated in the above-identified first and second modes (e.g., on and off states) by selectively controlling the temperature to be within different temperature ranges (e.g., the above-identified first and second temperature ranges). For example, a $VO_2$ based electrical interconnection may be selectively operated in the above-identified first mode by making the temperature thereof around 80° C. And, the same $VO_2$ based electrical interconnection may be selectively operated in the above-identified second mode by making the temperature thereof around 60° C.

As indicated in FIG. 2, less of a temperature transition may actually be required. Using conventional circuit design techniques, circuit operation may depend upon an order of magnitude change of resistance in a $VO_2$ based electrical interconnection. For example, the use and operation of circuits including a voltage divider circuit configuration are well known, and can have different operational characteristics depending on an order of magnitude change of resistance in one of the voltage divider configuration legs. As may be seen, an order of magnitude change in resistance of a $VO_2$ based electrical interconnection may be achieved with a temperature change of only a few degrees around 70° C. Accordingly, the sharp dependence of resistance upon temperature around 70° C. can be used to transition between the first and second modes—such that a 20° C. temperature fluctuation is not required. This advantageously translates into a need for only a few degrees of cooling where the circuit is maintained at an ambient temperature around 70° C., and where the transition between the first and second temperature ranges is relatively close to the ambient temperature.

According to an aspect of the present invention, the temperature of $VO_2$ based electrical interconnections may be selectively altered using thermionic cooling. By way of non-limiting explanation, thermionic cooling leverages the realization that a high work function cathode in contact with a heat source will emit electrons. When the electrons are absorbed by a cool low work function anode, they may be returned to the cathode—having the effect of cooling the cathode and heating the anode. Using a higher bandgap material between lower bandgap materials forming the cathode and anode provides a barrier to electron mobility there between. The amount of cooling equates to the product of the total current and average energy of carriers emitted over the barrier. Semiconductor heterostructure based thermionic coolers are discussed in U.S. Pat. No. 6,403,874, entitled HIGH-EFFICIENCY HETEROSTRUCTURE THERMIONIC COOLERS, by Shakouri et al., the disclosure of which is hereby incorporated by reference as if being set forth in its entirety herein.

Figure 3:
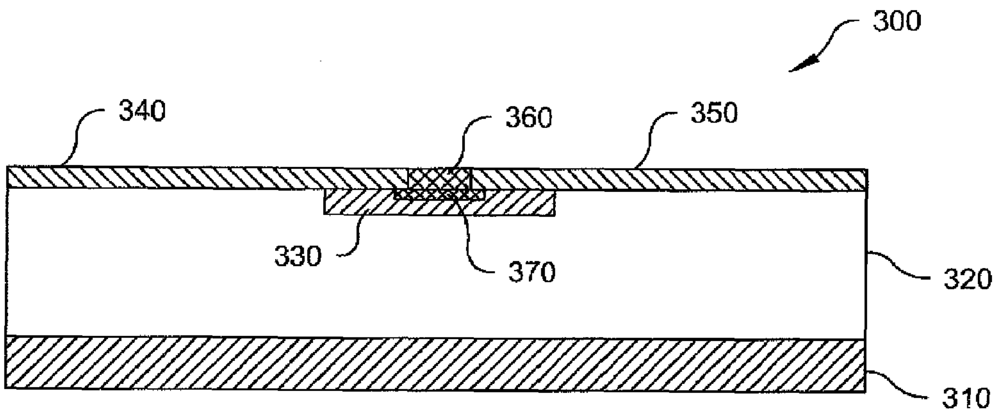
FIG. 3 illustrates a system according to an embodiment of the present invention.

Referring now to FIG. 3, there is shown a block diagram of a system 300. System 300 includes a dielectric material block 320 supporting a ground plane 310 and semiconductor substrate 330 on/in oppositely disposed surfaces thereof. Dielectric block 320 may take the form of an about 25 mil (0.635 mm) thick layer of Polytetrafluoroethylene (PTFE), for example. Ground plane 310 may take the form of an about 0.3 mil (0.00762 mm) thick layer of copper, for example. Semiconductor substrate 330 may take the form of an about 4 mil (0.1016 mm) thick layer of silicon, for example.

Dielectric 320 also supports gold microstrips 340, 350 that connect contacts (not shown) to substrate 330. Microstrips 340, 350 may take the form of conventional circuit board traces, for example. Each of microstrips 340, 350 is electrically coupled to $VO_2$ region 360. $VO_2$ region 360 may be selectively operated in the first mode by making the temperature thereof around 80° C.—thereby providing for a low resistance electrical connection between microstrips 340, 350. $VO_2$ region 360 may be selectively operated in the second mode by making the temperature thereof around 60° C.—thereby providing for a high resistance electrical connection between microstrips 340, 350. However, a much smaller temperature fluctuation may actually be used to transition between the first and second modes due to the sharp dependence of resistance of $VO_2$ around 70° C. Accordingly, region 360 is suitable for use as switching device 240 or 250 (FIG. 1).

System 300 also includes a $VO_2$ region 360 controller 370. Controller 370 may serve to sufficiently change the temperature of region 360, so as to transition it between the first and second modes. In the illustrated case, region 370 is beneath region 360. Region 370 may be alongside and/or over region 360 as well, or in lieu of being there-under. In any case, controller 370 may be seen to be thermally coupled to $VO_2$ region 360.

Controller 370 may be on the order of about 250 μm×250 μm in surface area. Controller 370 may be suitable for transitioning the temperature of region 260 between first and second temperature ranges including 80° C. and 60° C., respectively. Controller 370 may have a negligible transient heat load.

According to an aspect of the present invention, system 300 may be manufactured as follows. Dielectric block 320 may be bonded to ground plane 310 using conventional printed wiring board processes, such as those described in Roger's Material Guide. A pocket may be milled in dielectric 320 to accept substrate 330. Substrate 330 may be epoxied in place to dielectric 320. Microstrips 340, 350 may be separate, and both partially overlap substrate 330 and block 320. The portions of microstrips 340, 350 that overlap substrate 330 may be joined by solder, wirebond or ribbon bond to the portions that overlap block 320, respectively. Region 370 is formed on substrate 330, such as by using Molecular Beam Epitaxy (MBE) or Metal Organic Chemical Vapor Deposition (MOCVD) to form an integrated thermal controller. Region 360 may be deposited, and cured, onto the 370, 330 integrated controller to form a thermally controlled electrical switch. The 370, 330, 360 switch may be attached to dielectric 320 by epoxy. Alternatively, substrate 330, region 360, the portions of microstrips 340, 350 over substrate 330 and controller 370 may be assembled, and then attached to an assemblage of block 320 and the portions of microstrips 340, 350 over block 320.

Figure 4:
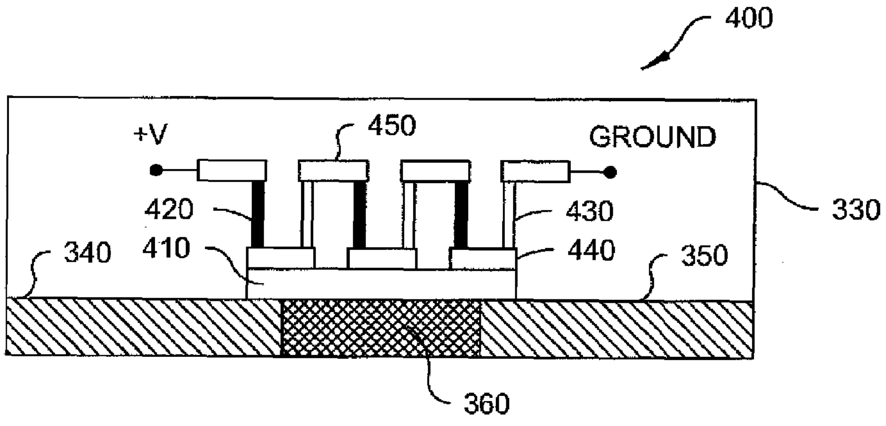
FIG. 4 illustrates a system according to another embodiment of the present invention.

In one configuration, controller 370 may take the form of a thermionic cooler apparatus. Referring now also to FIG. 4, there is shown a thermionic cooler apparatus 400 suitable for being used with system 300. In the illustrated embodiment of FIG. 4, cooler 400 is over region 360. Substrate 330, conductors 340, 350 and $VO_2$ region 360 have been illustrated for non-limiting purposes of explanation. Thermionic cooler 400 generally includes a thermal conduction block 410. Thermal conduction block 410 may take the form of an about 1 μm thick layer of gold, for example. Cooler 400 may optionally be thermally coupled to other conventional coolers to remove heat therefrom.

Cooler 400 further includes a combination of n-doped 420 and p-doped 430 devices coupled in electrical series, similar to conventional thermoelectric coolers. The cascade structure of devices 420, 430 serves to increase the cooling area of the device 10 without increasing input current demands. Electrons are injected at contact +V and emitted from GROUND. Electrons travel through each layer of devices 420, 430 and electrical contacts 440, 450 in a serpentine fashion, as in conventional thermoelectric coolers.

Devices 420 may be based upon alternating device and barrier layers, e.g., $GaAs/Al_xGa_{1-x}As$. Of course, other conventional device/barrier layer combinations, such as those incorporating Si, SiGe or SiC may be used. The barrier layers are n-type or p-type doped, to provide n-type and p-type devices 420, 430. Conventional semiconductor manufacturing techniques, such as Molecular Beam Epitaxy (MBE) or Metal Oxide Chemical Vapor Deposition (MOCVD) may be used to form devices 420, 430, as set forth in the incorporated U.S. Pat. No. 6,403,874.

According to an aspect of the present invention, $VO_2$ region 360 may be directly deposited onto cooler 400 or substrate 330, and the combination then soldered, epoxied, ribbon bonded or wire bonded to a host substrate.

By way of further, non-limiting explanation, cooler 400 may take the form of an InGaAs/InGaAsP material based thermionic cooling system. Cooler 400 may have around 5-20 barriers, each about 200 nm thick. Cooler 400 may have a thickness around 1.3 μm. Cooler 400 may have a specific heat around 0.340 J/g.K, a density around 5.5 $g/cm^3$ and a barrier height around 60 meV. Cooler 400 may provide for low-voltage (around 0.1 V), high-current operation, around 10 $e^4$ $A/cm^2$, have a capacitance around 6.64 pF, and an RC time constant around 0.3 ns (50 ohms). In such a configuration, a switching energy (for 0.1V) is expected around 33 fJ, which provides for a heat flow density around 320 $W/cm^2$, or around 200 mW cooling for region 260. Stored heat may typically be removed in around 10 ns, while an expected Carnot specific power=0.058 W/W, an expected efficiency to Carnot is around 35% and an expected specific power is around 0.167 W/W. It is expected this will provide for an input power requirement around 34 mW (+ohmic loss).

Figure 5:
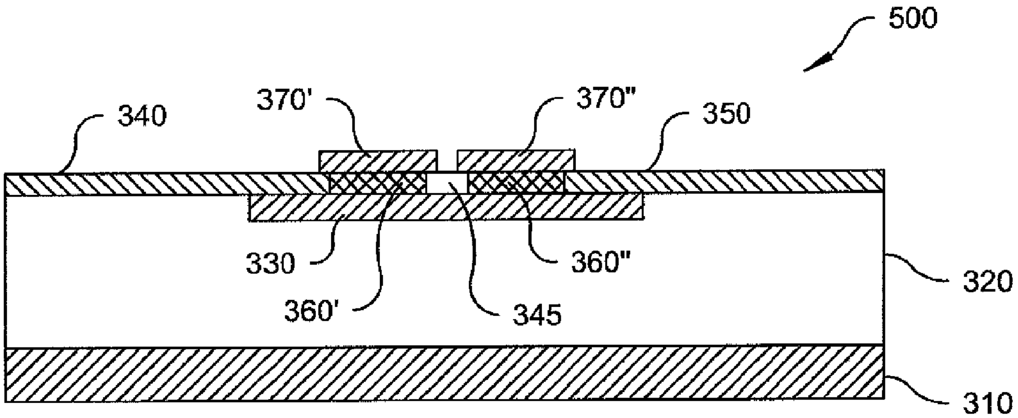
FIG. 5 illustrates a system according to another embodiment of the present invention.

Referring now also to FIG. 5, there is shown a block diagrammatic view of a system 500. System 500 includes the component elements of system 300, such that like elements will not be described again. In distinction, system 500 includes first and second $VO_2$ regions 360', 360", and associated first and second controllers 370', 370". Each of regions 360', 360" may be seen to be akin to region 360 (FIG. 3). Each of controllers 370', 370" may be seen to be akin to controller 370 (FIG. 3). System 500 also includes an isolation region 345 thermally interposed between regions 360', 360".

In such a configuration, regions 360', 360" may be individually operated in the first and second modes by selectively operating controllers 370', 370". The thermal conductivity between region 360' and controller 370", as well as the thermal conductivities between region 360" and controller 370', regions 360', 360" and controllers 370', 370" should be considered though, such that inadvertent thermal leakages do not inadvertently transition the regions 360', 360" between the first and second modes. This risk may be mitigated by providing a suitable thermal, e.g., spatial, separation between region 360'/controller 370' and region 360"/controller 370".

As set forth above, the present invention has a wide range of applicability. It may also be used to provide for re-configurable phased array radar devices, for example.

Referring now to FIG. 6, there is shown a selectively variable radiating element coupler configuration 600 according to an aspect of the present invention. Coupler 600 feeds radiating element R outputs P/2 responsively to an RF signal feed P. Coupler 600 may selectively feed radiating element R using three different signal paths corresponding to three distinct frequencies: $f_1$, $f_2$ and $f_3$. Each of the signal paths is defined by a combination of switching nodes 605, 610, 615, 620, 625, 630, 635, 640.

Figure 8:
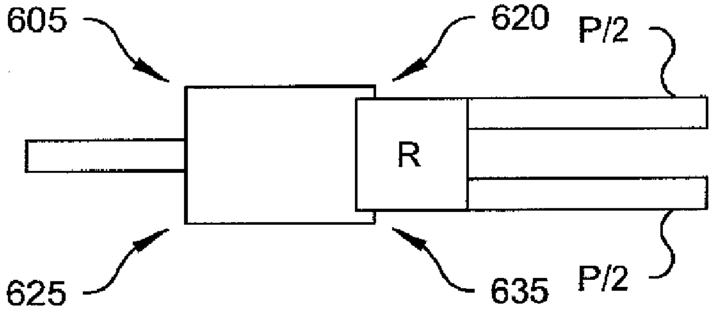
FIG. 8 illustrates the configuration of FIG. 6 in a first switched state.
Figure 9:
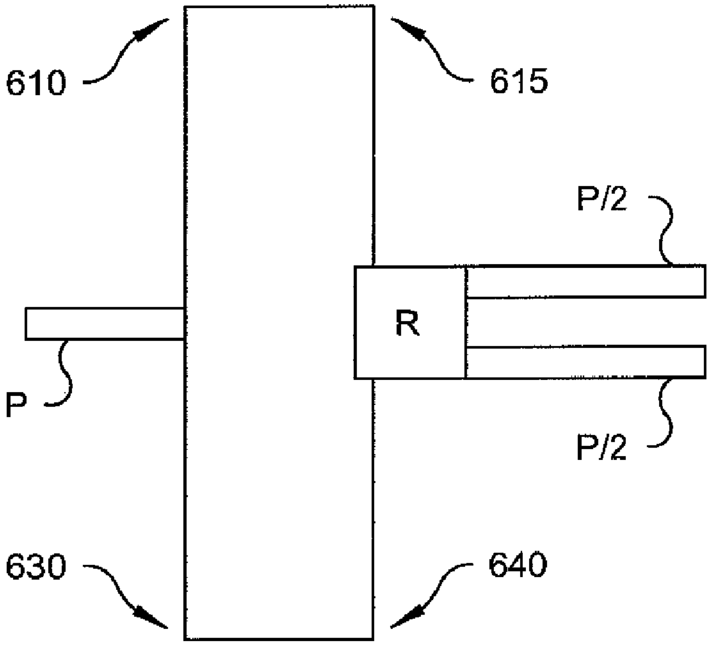
FIG. 9 illustrates the configuration of FIG. 6 in a second switched state.
Figure 10:
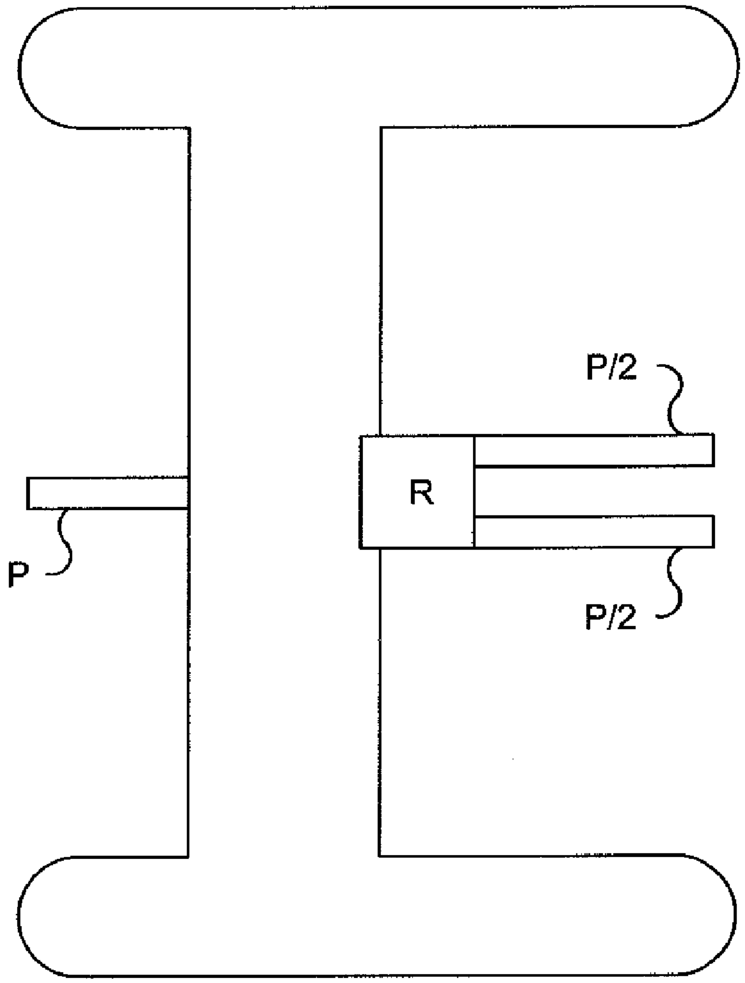
FIG. 10 illustrates the configuration of FIG. 6 in a third switched state.

Referring now also to FIG. 7, there is shown a diagram of a portion of system configuration 700. Each of nodes 605, 610, 615, 620, 625, 630, 635, 640 includes first and second $VO_2$ regions (705/710, 725/735, 720/745 and 730/740) electrically coupled between conductor traces. Selectively causing corresponding ones of the $VO_2$ regions to have a low resistance through temperature control provides a manner to select the desired signal path between feed P and resistor R. For example, inducing regions 705, 735, 740 and 745 to be highly resistive, while inducing regions 710, 720, 725, 730 to have a low resistance, through temperature control, provides for a signal path corresponding to radiating pattern frequency $f_1$. This is illustrated in FIG. 8. Similar sets of $VO_2$ regions may be configured to provide for radiating pattern frequency $f_2$ (FIG. 9) and radiating pattern frequency $f_3$ (FIG. 10).

Figure 11:
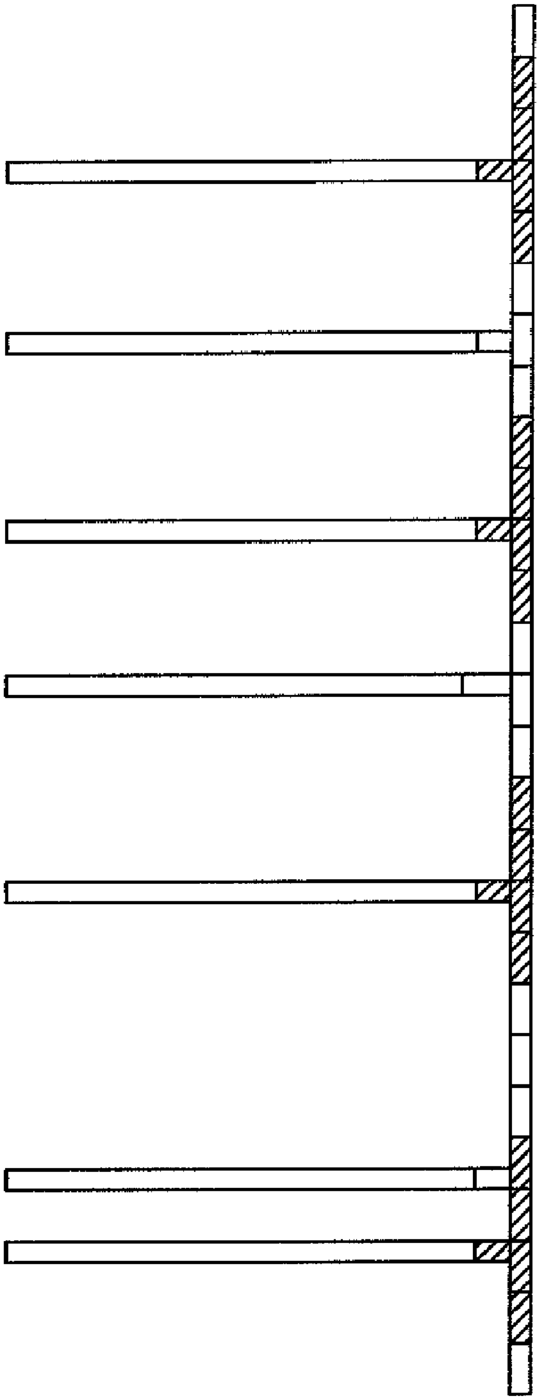
FIG. 11 illustrates a side view of a radiating element pattern corresponding to the first switched state.
Figure 12:
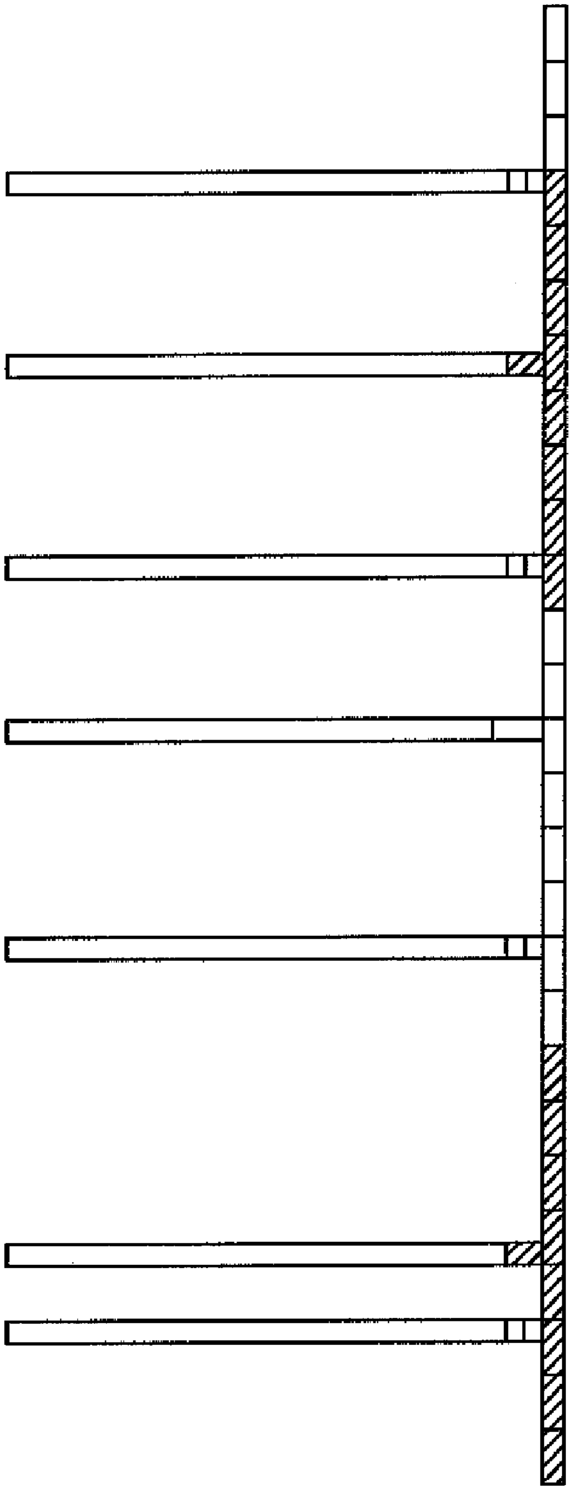
FIG. 12 illustrates a side view of a radiating element pattern corresponding to the second switched state.
Figure 13:
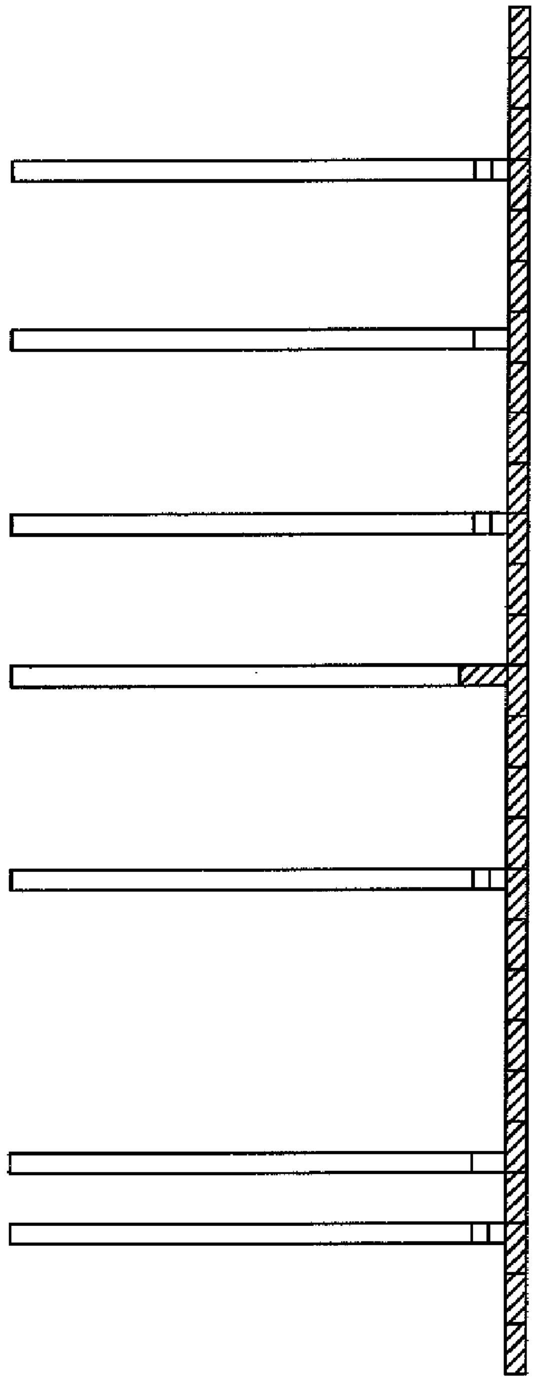
FIG. 13 illustrates a side view of a radiating element pattern corresponding to the third switched state.

Referring now also to FIG. 11, there is shown a side-plan view of a radiating pattern corresponding to the configuration of FIG. 6 with select $VO_2$ regions configured as is shown in FIG. 8 to provide for frequency $f_1$. FIG. 12 shows a side-plan view of a radiating pattern corresponding to the configuration of FIG. 6 with select $VO_2$ regions configured as is shown in FIG. 9 to provide for frequency $f_2$. FIG. 13 provides a side-plan view of a radiating pattern corresponding to the configuration of FIG. 6 with select $VO_2$ regions configured as is shown in FIG. 10 to provide for frequency $f_3$. The present invention may be used to dynamically reconfigure phased array radar antenna radiating elements in phased array antennas.

Figure 14:
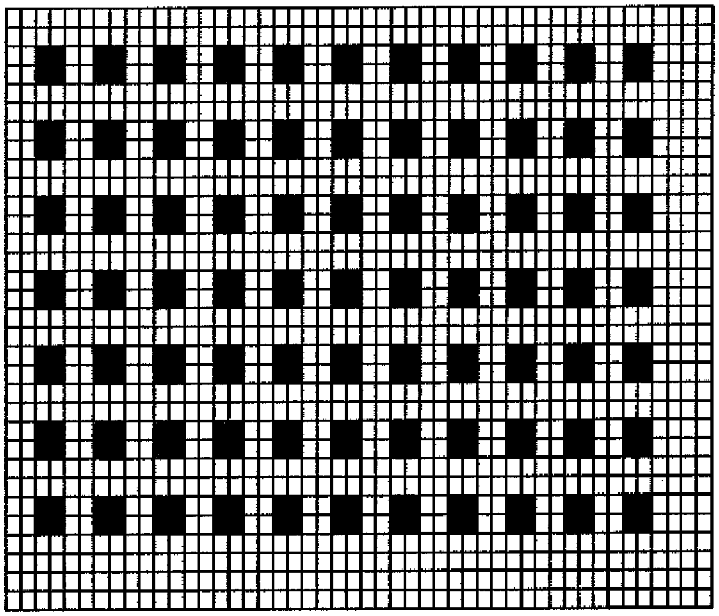
FIG. 14 illustrates a front view of the radiating element pattern of FIG. 11.
Figure 15:
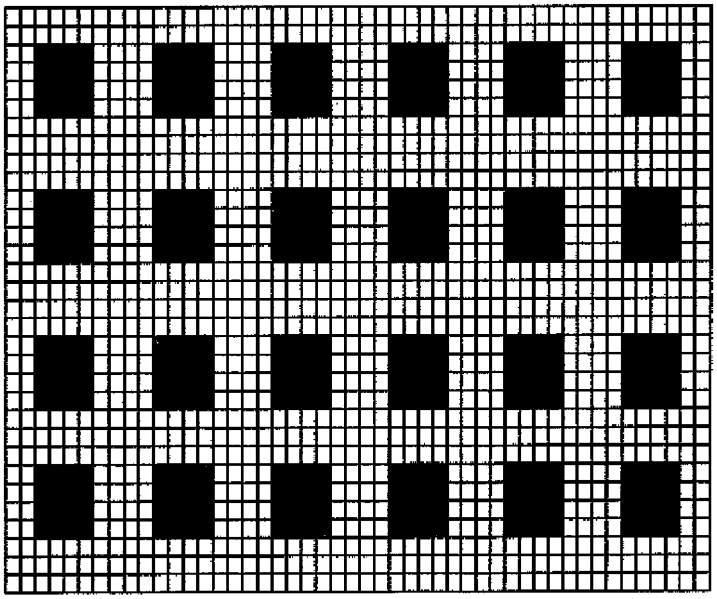
FIG. 15 illustrates a front view of the radiating element pattern of FIG. 12; and, FIG. 16 illustrates a front view of the radiating element pattern of FIG. 13.
Figure 16:
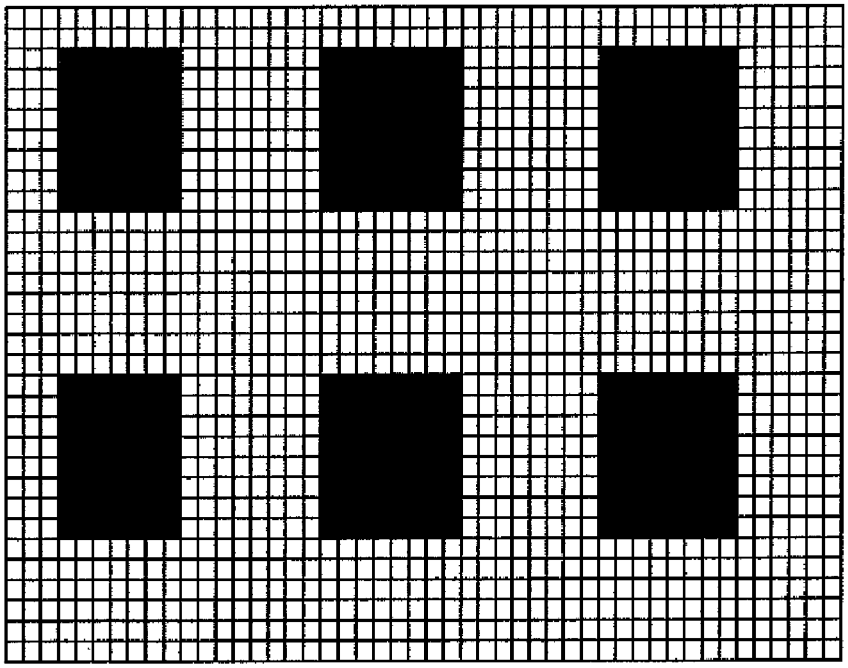

Referring now also to FIG. 14, there is shown a front, plan-view of the radiating pattern of FIG. 11. FIG. 15 shows a front, plan-view of the radiating pattern of FIG. 12 while FIG. 16 provides a front, plan-view of the radiating pattern of FIG. 13.

While the foregoing invention has been described with reference to the above-described embodiment, various modifications and changes can be made without departing from the spirit of the invention. Accordingly, all such modifications and changes are considered to be within the scope of the appended claims.

What is claimed is:

1. A switching circuit comprising:

first and second conductors;

at least two vanadium oxide regions, each electrically coupled to a corresponding one of said first and second conductors;

at least two thermionic coolers;

wherein each thermionic cooler is thermally coupled to one of said vanadium oxide regions for transitioning one of said vanadium oxide regions from a first temperature range where said vanadium oxide region is substantially conductive, to a second temperature range where said vanadium oxide region is substantially non-conductive; and an isolation region that separates each of said vanadium oxide regions and corresponding said thermionic coolers to mitigate thermal leakage between said regions;

whereby thermal leakage from one of said coolers associated with a transitioned vanadium oxide region is insufficient to transition the other of said vanadium oxide regions.

2. The circuit of claim 1, wherein said at least two vanadium oxide regions comprises $VO_2$.

3. The circuit of claim 1, where said at least two vanadium oxide regions comprise at least one of: $VO_2$, VO, $V_2O_3$ and $V_2O_5$.

* * * * *

UNITED STATES PATENT AND TRADEMARK OFFICE

CERTIFICATE OF CORRECTION

PATENT NO. : 7,583,176 B1
APPLICATION NO. : 11/370766
DATED : September 1, 2009
INVENTOR(S) : Kevin L. Robinson It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 597 days.

Signed and Sealed this

Fourteenth Day of September, 2010

David J. Kappos
*Director of the United States Patent and Trademark Office*